United States Patent
Ishida et al.

(10) Patent No.: US 6,344,396 B1
(45) Date of Patent: Feb. 5, 2002

(54) REMOVABLE SPACER TECHNOLOGY USING ION IMPLANTATION FOR FORMING ASYMMETRIC MOS TRANSISTORS

(75) Inventors: Emi Ishida, Sunnyvale; Srinath Krishman, Campbell; Ming Yin Hao; Effiong Ibok, both of Sunnyvale, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/667,601

(22) Filed: Sep. 22, 2000

Related U.S. Application Data (60) Provisional application No. 60/155,605, filed on Sep. 24, 1999.

(51) Int. Cl.[7] .............................................. H01L 21/336
(52) U.S. Cl. ..................................... 438/286; 438/705
(58) Field of Search .................................. 438/286, 305, 438/303, 301, 705

(56) References Cited

U.S. PATENT DOCUMENTS

| | | | |
|---|---|---|---|
| 4,956,314 A | * | 9/1990 | Tam et al. |
| 5,510,279 A | | 4/1996 | Chien et al. |
| 5,547,885 A | | 8/1996 | Ogoh |
| 5,789,298 A | * | 8/1998 | Gardner et al. ............. 438/286 |
| 5,811,338 A | | 9/1998 | Kao et al. |
| 6,030,898 A | * | 2/2000 | Liu ............................ 438/692 |
| 6,140,168 A | * | 10/2000 | Tan et al. ................... 438/197 |
| 6,140,186 A | * | 10/2000 | Lin et al. ................... 438/286 |
| 6,200,864 B1 | * | 3/2001 | Selcuk ....................... 438/286 |

* cited by examiner

*Primary Examiner*—Richard Booth (57) ABSTRACT

Sub-micron-dimensioned, asymmetrically-configured MOS and/or CMOS transistors are fabricated using removable sidewall spacers made of a material, such as UV-nitride, one of which is selectively treated subsequent to deposition, e.g., by ion implantation, to augment the etch rate thereof with a room temperature etchant, e.g., dilute aqueous HF. The treated spacer is removed with the dilute, aqueous HF prior to implantation of asymmetrically-configured, moderately or heavily-doped source/drain regions but prior to any post-implantation annealing processing, in order not to increase the etch resistance of the spacer material by thermally-induced densification.

18 Claims, 2 Drawing Sheets

REMOVABLE SPACER TECHNOLOGY USING ION IMPLANTATION FOR FORMING ASYMMETRIC MOS TRANSISTORS

RELATED APPLICATIONS

This application claims priority from U.S. Provisional Patent Application Ser. No. 60/155,605, filed Sep. 24, 1999, and is incorporated herein by reference.

FIELD OF THE INVENTION

The present invention relates to a method of manufacturing semiconductor devices, e.g., asymmetric MOS-type transistors and integrated circuits comprising such devices, with improved processing methodology resulting in increased reliability and quality, increased manufacturing throughput, and reduced fabrication cost. The present invention is also useful in the manufacture of asymmetric CMOS semiconductor devices and has particular applicability in fabricating high-density integration semiconductor devices with design features below about 0.18 μm, e.g., about 0.15 μm and below.

BACKGROUND OF THE INVENTION

The escalating requirements for high density and performance associated with ultra large-scale integration (ULSI) semiconductor devices requires design features of 0.18 μm and below, such as 0.15 μm and below, increased transistor and circuit speeds, high reliability, and increased manufacturing throughput for economic competitiveness. The reduction of design features to 0.18 μm and below challenges the limitations of conventional semiconductor manufacturing techniques.

As feature sizes of MOS and CMOS devices have decreased to the sub-micron range, so-called "short-channel" effects have arisen which tend to limit device performance. For n-channel MOS transistors, the major limitation encountered is caused by hot-electron-induced instabilities. This problem occurs due to high electrical fields between the source and drain, particularly near the drain, such that charge carriers, either electrons or holes, are injected into the gate or semiconductor substrate. Injection of hot carriers into the gate can cause gate oxide charging and threshold voltage instabilities which accumulate over time and greatly degrade device performance. In order to counter and thus reduce such instabilities, lightly-doped source/drain extension type transistor structures have been developed, as described below.

For p-channel MOS transistors of short-channel type, the major limitation on performance arises from "punch-through" effects which occur with relatively deep junctions. In such instances, there is a wider sub-surface depletion effect and it is easier for the field lines to go from the drain to the source, resulting in the above-mentioned "punch-through" current problems and device shorting. To minimize this effect, relatively shallow junctions are employed in forming p-channel MOS transistors.

The most satisfactory solution to date of hot carrier instability problems of MOS devices is the provision of lightly- or moderately-doped source/drain extensions driven just under the gate region, while the heavily-doped drain region is laterally displaced away from the gate by use of a sidewall spacer on the gate. Such structures are particularly advantageous because they do not have problems with large lateral diffusion and the channel length can be set precisely.

Several processing sequences or schemes have been developed for the manufacture of source/drain extension-type MOS and CMOS transistors for use in high-density integration applications, with a primary goal of simplifying the manufacturing process by reducing and/or minimizing the requisite number of processing steps. Conventional processing schemes for making such MOS transistors generally employ disposable spacers made of various materials, e.g., polysilicon, silicon oxides, silicon nitrides, silicon oxynitrides, and combinations thereof.

According to one conventional process scheme, a precursor structure comprising a semiconductor substrate of one conductivity type having a layer stack comprising a thin gate oxide layer and an overlying gate electrode formed on a portion of a surface thereof is subjected to ion implantation prior to sidewall spacer formation, for forming lightly- or moderately-doped implants therein. Following post-implantation annealing, sidewall spacers are formed on the pair of opposing side surfaces of the layer stack by first depositing a dielectric spacer material layer over the substrate surfaces and then removing same from the horizontally-oriented regions, i.e., the top surface of the gate electrode layer and the source and drain regions, by means of anisotropic etching. Such processing results in sidewall spacers left on the side surfaces of the gate layer stack that have an approximately quarter-circular shaped cross-section. The dielectric sidewall spacers typically remain through the balance of junction formation processing. After sidewall spacer formation, a heavy source/drain implantation is performed, with the gate layer stack and associated sidewall spacers acting as implantation masking materials. As a consequence of the separate implantations, the heavily-doped source/drain regions are laterally displaced from the gate edges by the thickness of the sidewall spacer material and the lightly- or moderately-doped regions beneath the sidewall spacers act as source/drain extensions.

According to another conventional process scheme, which scheme employs disposable (i.e., removable) sidewall spacers, a precursor structure as described above and comprising a semiconductor substrate of one conductivity type having a layer stack comprising a thin gate oxide layer and an overlying gate electrode layer formed on a portion of a surface thereof is subjected to blanket-type dielectric layer deposition and patterning to form sidewall spacer layers on opposing side surfaces of the layer stack. Opposite conductivity type p- or n-type dopant impurities are then implanted into the substrate using the layer stack with sidewall spacers formed thereon as an implantation mask, to thereby form moderately- to heavily-doped implants. High temperature annealing is then performed to thermally activate the implanted dopant by diffusion and reduce lattice damage due to implantation, thereby forming source/drain regions and junctions at a predetermined density and depth below the substrate surface. The effective length of the channel of such transistors is determined by the width of the gate insulator/gate electrode layer stack and the width of the sidewall spacers formed thereon. After activation annealing, the sidewall spacers are removed, as by etching, and a second implantation process for implanting n- or p-type opposite conductivity type dopant impurities is performed using only the gate insulating layer/gate electrode layer stack as an implantation mask, thereby forming shallow-depth, lightly- or moderately-doped implants in the substrate in the spaces between the deeper, heavily-doped source/drain regions. Following this implantation, a second activation process, e.g., rapid thermal annealing (RTA), is performed for effecting dopant diffusion/activation and relaxation of implantation-induced lattice damage of the implants, to form shallow-depth, lightly- or moderately-doped source/drain extensions extending from respective proximal edges of the heavily-doped source/drain regions to just below the respective proximal edges of the gate insulator layer/gate electrode layer stack.

In a variant of the above-described process, the sidewall spacers are comprised of a layer of a first (or inner) dielectric material and a layer of a second (or outer) dielectric material. According to the process methodology of this variant, only the second, or outer, dielectric sidewall spacer layer is removed subsequent to annealing for forming the moderately- to heavily-doped source/drain regions. The first, or inner, dielectric sidewall spacer layer is retained for protecting the gate insulator/gate electrode layer stack during subsequent processing, e.g., for contact formation.

Each of the above-described variants employ removable sidewall spacers as part of an implantation mask for defining the channel lengths, and each incurs a drawback in that the materials conventionally used for the sidewall spacers, such as those enumerated above, frequently are difficult and time consuming to remove by standard etching methodologies, particularly when densified as a result of high temperature processing for post-implantation annealing for dopant activation/lattice damage relaxation. For example, and as described in U.S. Pat. No. 5,766,991, removal of silicon nitridebased spacer layers can require etching in a hot phosphoric acid ($H_3PO_4$) bath at about 180° C. for approximately 1.5 hours. Such long etching time results in reduced manufacturing throughput and the extended exposure to and concomitant attack by the corrosive etchant at high temperature results in undesired etching and defect formation. Moreover, portions of the workpiece substrate not intended to be etched must be provided with an etch-resistant protective barrier layer, e.g., of silicon oxide, prior to etching. However, the etching resistance of the silicon oxide layer itself to the hot phosphoric acid may be insufficient, in which case the resistance thereof must be increased prior to etching, e.g., by first annealing it at about 900° C. in an oxygen ambient. Alternatively, resistance to attack by the hot $H_3PO_4$ may be obtained by use of an oxide-polysilicon bi-layer. In either case, such requirement for provision of at least one layer for protecting from acid attack disadvantageously adds processing time, complexity, and fabrication cost. Etching of annealed, densified silicon oxide and/or silicon oxynitridebased sidewall spacer layers is similarly difficult.

Another approach towards alleviating or eliminating the problems of "short-channel" effects in sub-micron dimensioned MOS transistors, such as the above-mentioned "hot carrier" injection and "punch-through" phenomena, is the formation of "asymmetric" source/drain structures, i.e., structures where the source and drain regions, including their associated lightly-doped, shallow-depth extensions, are not identically formed and constituted. For example, U.S. Pat. No. 5,510,279 issued Apr. 23, 1996, discloses a method of fabricating an asymmetric lightly doped drain transistor device, wherein the drain region is shielded with a barrier layer when ion implantation is conducted for implanting a highly doped source region. Following this implantation, a large angle implantation of opposite conductivity type dopant ions is performed for establishing a lightly doped "pocket" region adjacent the highly doped source region. The angled implantation which forms the pocket region increases the doping concentration along the device's source side, thereby increasing the threshold voltage and, consequently diminishing "short-channel" effects.

In another approach, disclosed in U.S. Pat. No. 5,811,338 issued Sep. 22, 1998, "DIBL" (i.e., Drain-Induced Barrier Lowering) and "hot electron" short-channel effects in MOS transistors are alleviated by forming a second polarity internal junction region entirely within one of otherwise similar, first polarity source and drain regions. In yet another approach, disclosed in U.S. Pat. No. 5,547,885 issued Aug. 20, 1996, the widths of sidewall spacers on opposite side surfaces of gate insulator/gate electrode layer stacks are different; as a consequence thereof, the heavily doped source and drain regions, along with their respective shallow depth, lightly-doped extensions are of different lengths, resulting in formation of an asymmetric transistor structure wherein the hot carrier effect is suppressed by reducing peak field strength of a drain depletion layer caused by "pinch-off".

A need exists for improved semiconductor manufacturing methodology for fabricating MOS and CMOS transistors exhibiting reduced short-channel effects such as are obtainable by formation of asymmetric structures as described above, by a process which employs removable spacer technology yet does not suffer from the above-described drawbacks associated with the difficulty in conveniently and rapidly removing densified sidewall spacers according to conventional etching techniques. Moreover, there exists a need for an improved process for fabricating asymmetrically-configured MOS transistor-based devices which is fully compatible with conventional process flow and provides increased manufacturing throughput and product yield.

The present invention fully addresses and solves the above-described problems and drawbacks attendant upon the application of conventional processing methodology for forming submicron-dimensioned, asymmetrically configured MOS and CMOS transistors for use in high-density semiconductor integrated circuit devices, particularly in providing a process utilizing a pair of removable dielectric sidewall spacer layers formed of a dielectric material, one of the pair being selectively subjected to a post-formation treatment for increasing the etchability thereof vis-a-vis that of its as-deposited state, wherein the treated spacer is readily removed by etching prior to a heavy ion implantation for defining heavily-doped source and drain regions, followed by thermal annealing treatment for dopant activation/lattice damage relaxation, which thermal annealing may disadvantageously density and thus increase the etching resistance of the spacer material. As a consequence of the selective removal of only one of the sidewall spacers, the heavy ion implantation results in asymmetric source/drain formation, i.e., the source or drain region formed at the side of the gate insulator/gate electrode layer stack from which the sidewall spacer has been removed is formed with its proximal edge reaching to just beneath the respective proximal edge of the gate insulator layer, whereas the source or drain region formed at the other side of the gate insulator/gate electrode layer stack having the sidewall spacer thereon is spaced-away therefrom by a distance approximately equal to the width of the spacer at its lower end adjacent the substrate surface. Following the heavy ion implantation, the remaining one of the sidewall spacers is removed by etching, and thermal annealing for diffusion/activation of the implanted dopant ions/atoms is performed. A second ion implantation is then performed for forming a shallow-depth, lightly-doped extension extending from the proximal edge of the spaced-away source or drain region to just beneath the respective proximal edge of the gate insulator layer. Relatively thin inner spacers formed of a dielectric material which is substantially less readily etched than the removable outer spacers are optionally provided on the opposing side surfaces of the gate insulator/gate electrode layer stack, which spacers are retained throughout processing for protecting the gate insulator/gate electrode layer stack from attack by corrosive atchant and during subsequent metallization for contact formation.

DISCLOSURE OF THE INVENTION

An advantage of the present invention is an improved method for manufacturing asymmetrically-configured MOS and/or CMOS transistor devices utilizing a removable spacer.

Another advantage of the present invention is an improved method for increasing the etchability of dielectric spacer materials utilized in the manufacture of asymmetrically-configured MOS, CMOS, and other types of semiconductor devices.

Yet another advantage of the present invention is an improved method for manufacturing asymmetrically-configured MOS and/or CMOS transistor devices utilizing a removable sidewall spacer formed of a readily etchable dielectric material.

Still another advantage of the present invention is an improved method of manufacturing submicron-dimensioned asymmetrically-configured MOS transistors for use in high-density semiconductor integrated circuit devices at lower cost, higher manufacturing throughput, and increased product yield and reliability than are obtainable with conventional process methodology.

Yet another advantage of the present invention is an improved asymmetrically-configured, submicron-dimensioned MOS transistor having a reduced amount of "short-channel" effects.

Additional advantages and other features of the present invention will be set forth in the description which follows and in part will become apparent to those having ordinary skill in the art upon examination of the following or may be learned from the practice of the instant invention. The advantages of the present invention may be realized and obtained as particularly pointed out in the appended claims.

According to an aspect of the present invention, the foregoing and other advantages are achieved in part by a method of manufacturing a semiconductor device, which method comprises the sequential steps of:

(a) providing a device precursor structure comprising a semiconductor substrate of a first conductivity type and a layer stack formed on a portion of a surface of the substrate, the layer stack comprising:
   i. a thin gate insulating layer in contact with the substrate surface; and
   ii. a gate electrode layer formed on the gate insulating layer, the layer stack comprising first and second opposing side surfaces and a top surface;

(b) forming first and second insulative, tapered sidewall spacers on respective first and second opposing side surfaces of said layer stack, each of the sidewall spacers comprising a dielectric material having an as-deposited etch resistance;

(c) selectively positioning a masking material over the first sidewall spacer on the first opposing side surface of the layer stack;

(d) selectively treating the exposed second sidewall spacer on the second opposing side surface of the layer stack for reducing the etch resistance of the dielectric material from its as-deposited state to a more readily-etchable state;

(e) removing the masking material from over the first sidewall spacer;

(f) selectively removing the reduced etching resistance second sidewall spacer by an etching process;

(g) selectively introducing dopant impurities of a second, opposite conductivity type into exposed portions of the substrate surface adjacent the first sidewall spacer and adjacent the second opposing side surface of the layer stack to form a pair of spaced-apart, heavily-doped regions in the substrate;

(h) removing the first sidewall spacer by an etching process;

(i) thermally treating the pair of spaced-apart, heavily-doped regions to form a pair of heavily-doped source/drain regions in the substrate each having a junction therewith at a predetermined depth below the substrate surface, a first one of the pair of heavily-doped source/drain regions being laterally spaced away from a respective proximal edge of the gate insulating layer by a distance substantially equal to the width of the lower end of the first sidewall spacer adjacent the substrate surface and a second one of the pair of heavily-doped source/drain regions extending to just beneath a respective proximal edge of the gate insulating layer;

(j) selectively introducing second, opposite conductivity type dopant impurities into the exposed portion of the substrate surface intermediate the gate insulating layer and the first, laterally spaced-away, heavily-doped source/drain region to form a lightly- or moderately-doped extension region; and (k) thermally treating the lightly- or moderately-doped extension region to form a shallow-depth, lightly- or moderately-doped source/drain extension in the substrate extending from a proximal edge of the first, laterally spaced-away, heavily-doped source/drain region to just beneath the respective proximal edge of the gate insulating layer.

In embodiments according to the present invention, step (a) comprises providing a silicon wafer substrate of n or p first conductivity type, the thin gate insulating layer comprises a silicon oxide layer about 25–50 Å thick, and the gate electrode layer comprises heavily-doped polysilicon; step (b) comprises forming the first and second sidewall spacers from a dielectric material having an as-deposited etch resistance and comprising a UV-nitride, each of the tapered sidewall spacers having a width profile varying from relatively wide at the lower end thereof adjacent the substrate surface to relatively narrow at the upper end thereof; step (c) comprises selectively forming a layer of photoresist over the first sidewall spacer or selectively positioning an ion implantation mask over the first sidewall spacer; step (d) comprises selective ion implantation of the second sidewall spacer, comprising selectively implanting impurity ions selected from $Si^+$, $Ge^+$, and p and n type dopant ions at preselected dosages and energies; step (f) comprises selectively removing the ion implanted, reduced etching resistance second insulative sidewall spacer by etching with dilute aqueous HF, e.g., 1:100 $HF/H_2O$ at about 20–35° C.; step (g) comprises selectively implanting dopant ions of second, opposite conductivity type at dosages of from about $5\times10^{14}$ to about $5\times10^{15}$ atoms/cm$^2$ and energies of from about 20 to about 60 KeV; step (h) comprises etching the first sidewall spacer with dilute aqueous HF, e.g., 1:100 $HF/H_2O$ at about 20–35° C.; step (i) comprises rapid thermal annealing to diffuse and activate the second conductivity type dopant impurities introduced during step (g) to form the pair of heavily-doped source/drain regions; step (j) comprises selectively implanting dopant ions of second conductivity type at dosages of from about $5 \times 10^{13}$ to about $5 \times 10^{14}$ atoms/cm$^2$ and energies of from about 5 to about 30 KeV; and step (k) comprises rapid thermal annealing to diffuse and activate the second conductivity type dopant impurities introduced during step (j) to form the shallow-depth, lightly- or moderately-doped source/drain extension.

According to a further embodiment of the present invention, the method comprises forming a relatively narrow sidewall spacer on each of the first and second opposing side surfaces of the layer stack prior to performing step (b), the relatively narrow sidewall spacers comprising an etch resistant material which is retained throughout processing, and selected from silicon oxides, silicon nitrides, and silicon oxynitrides.

According to another aspect of the present invention, a method of manufacturing an asymmetrically-configured silicon-based MOS-type transistor is provided, which method comprises the sequential steps of:

(a) providing a MOS transistor precursor structure comprising a silicon semiconductor wafer substrate of a first conductivity type and a layer stack formed on a portion of a surface of the wafer, the layer stack comprising:
  i. a thin gate insulating layer comprising a silicon oxide layer about 25–50 Å thick in contact with the wafer surface; and
  ii. a gate electrode layer comprising heavily-doped polysilicon formed on the gate insulating layer, the layer stack comprising first and second opposing side surfaces and a top surface;

(b) forming first and second, relatively narrow insulative, tapered sidewall spacers on respective ones of said first and second opposing side surfaces, said first and second relatively narrow sidewall spacers comprising a first, relatively etch-resistant dielectric material selected from silicon oxides, silicon nitrides, and silicon oxynitrides;

(c) forming first and second relatively wide, insulative, tapered sidewall spacers on respective ones of the first and second sidewall spacers, the first and second relatively wide sidewall spacers comprising a second dielectric material comprising a UV-nitride having an as-deposited etch resistance;

(d) selectively positioning a masking material over the sidewall spacers on the first opposing side surface of the layer stack;

(e) selectively implanting the exposed second, relatively wide sidewall spacer on the second opposing sidewall surface of the layer stack with impurities for reducing the etch resistance from its as-deposited state to a more readily-etchable state;

(f) removing the masking material from over the sidewall spacers on the first opposing side surface of the layer stack;

(g) selectively removing the reduced etching resistance, second relatively wide sidewall spacer layer by etching with dilute aqueous HF;

(h) selectively implanting dopant impurities of a second, opposite conductivity type into exposed portions of the substrate surface adjacent the first relatively wide sidewall spacer and adjacent the second relatively narrow sidewall spacer to form a pair of spaced-apart, heavily-doped implants in the wafer;

(i) removing the first relatively wide sidewall spacer by an etching process with dilute aqueous HF;

(j) performing rapid thermal annealing to diffuse and activate the dopant impurities implanted in step (h), thereby forming a pair of heavily-doped source/drain regions in the wafer substrate, each having a junction therewith at a predetermined depth below the wafer surface, a first one of the pair of heavily-doped source/drain regions being laterally spaced away from a respective proximal edge of the gate insulating layer by a distance substantially equal to the width of the lower end of the relatively wide sidewall spacer adjacent the wafer surface and a second one of the pair of heavily-doped source/drain regions extending to just beneath a respective proximal edge of the gate insulating layer;

(k) selectively implanting second, opposite conductivity type dopant impurities into the exposed portion of the wafer surface intermediate the gate insulating layer and the first, laterally spaced-away, heavily-doped source/drain region to form a lightly- or moderately-doped extension region; and (l) performing rapid thermal annealing to diffuse and activate the dopant impurities implanted in step (k), thereby forming a shallow-depth, lightly- or moderately-doped source/drain extension extending from the proximal edge of the first, laterally spaced-away, heavily-doped source/drain region to just beneath the respective proximal edge of the gate insulating layer.

According to yet another aspect of the present invention, silicon-based, asymmetrically-configured MOS-type transistor devices formed by the method of the above-enumerated steps (a)–(l) are provided.

According to still another aspect of the present invention, an asymmetrically-configured MOS-type transistor device comprises:

(a) a semiconductor substrate of one conductivity type and having a surface;

(b) a layer stack formed on a portion of the surface, the layer stack comprising:
  i. a thin gate insulating layer in contact with the substrate surface; and
  ii. a gate electrode layer formed on the gate insulating layer; and (c) a pair of source and drain regions of opposite conductivity type formed within the substrate and extending to just beneath opposite edges of the gate insulating layer, wherein:
  i. a first one of the pair of source and drain regions comprises a first, heavily-doped portion laterally spaced away from the respective proximal edge of the gate insulating layer and having a relatively deep junction depth, and a second, shallow-depth, moderately or lightly-doped extension portion extending from the proximal edge of the first portion to just beneath the respective proximal edge of the gate insulating layer; and
  ii. a second one of the pair of source and drain regions comprises a heavily-doped, relatively deep junction depth portion extending to just beneath the respective proximal edge of the gate insulating layer.

In embodiments according to the invention, the semiconductor substrate comprises a monocrystalline silicon wafer of p or n first conductivity type, the thin gate insulating layer comprises a silicon oxide layer about 25–50 Å thick, and the gate electrode layer comprises heavily-doped polysilicon; and the first one the pair of source and drain regions comprises a source region and the second one of the pair of source and drain regions comprises a drain region, or alternatively, the first one of the pair of source and drain regions comprises a drain region and the second one of the pair of source and drain regions comprises a source region.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

DESCRIPTION OF THE INVENTION

The present invention addresses and solves problems arising from manufacturing submicron-dimensioned, asymmetrically-configured MOS and CMOS transistors suitable for use in high-density integration semiconductor devices, wherein, as part of the fabrication methodology, sidewall spacers which act as at least part of an implantation mask during the formation of moderately- to heavily-doped source/drain regions are removed, as by etching, prior to implantation for forming lightly- or moderately-doped source/drain extensions. More specifically, the present invention advantageously provides a significant and substantial reduction in the duration and corrosive severity of the requisite anisotropic etching step for selectively removing the implantation masking sidewall spacers, thereby increasing device reliability and manufacturing throughput, while decreasing fabrication cost and product yield problems associated with the conventional technology. In addition, the inventive method is fully compatible with other aspects of existing processing methodology.

According to the present invention, a method of manufacturing asymmetrically-configured MOS and CMOS transistors is provided which utilizes a pair of relatively wide, removable sidewall spacer layers formed on opposing side surfaces of a gate insulator/gate electrode layer stack, one of the spacers comprising a dielectric material which has been selectively treated, as by ion implantation, to reduce the etching resistance thereof from its as-deposited state to an easily and rapidly etched state. Following easy removal of the treated sidewall spacer by etching, an ion implantation process is performed wherein the remaining one of the sidewall spacers performs a masking function for forming a moderately- to heavily-doped source/drain region spaced a predetermined distance away from the respective proximal edge of the gate insulator/gate electrode layer stack. By contrast, the heavily-doped source/drain region formed where the sidewall spacer has been selectively removed extends to just beneath the respective proximal edge of the gate insulator/gate electrode layer stack. The remaining sidewall spacer is then removed by etching prior to any post-implantation thermal annealing treatment for dopant activation and lattice damage relaxation, which thermal treatment may disadvantageously result in densification of the sidewall spacer material, with a concomitant increase in the etching resistance thereof. Thermal annealing treatment is performed subsequent to removal of the remaining spacer, followed by a second implantation process for forming a shallow-depth, lightly-doped source/drain extension extending from the proximal edge of the spaced-away, heavily-doped, source/drain region to just beneath the respective proximal edge of the gate insulator/gate electrode layer stack. Relatively thin, etch resistant spacers, which are retained throughout device processing for protecting the gate insulator/gate electrode layer stack from attack by corrosive etchant during removal of the relatively wide spacers (as well as during subsequent metallization for contact formation), may be optionally provided intermediate the opposing sidewall surfaces and the sidewall spacer layers.

Figure 1A:
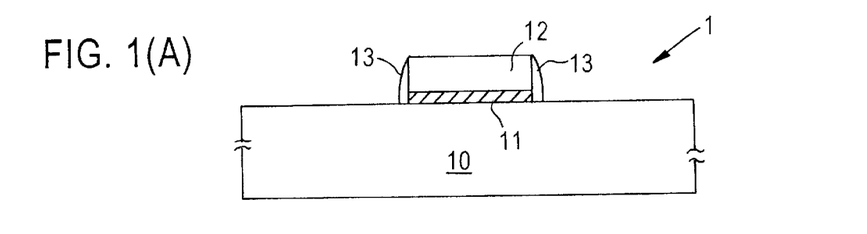
FIGS. 1(A)–1(J) illustrate, in simplified, cross-sectional form, a sequence of processing steps for forming an asymmetrically-configured MOS-type transistor according to an embodiment of the present invention, wherein like reference numerals are employed throughout for designating like features and/or components of the invention.

Referring now to FIGS. 1(A)–1(J), shown therein is a sequence of steps for performing an illustrative, but not limitative, MOS-based embodiment of the present invention, wherein similar reference numerals are used throughout to denote similar features. As will be apparent to one of ordinary skill in the art, the inventive process may be readily adapted for use in the manufacture of CMOS transistors and similar devices. Referring more particularly to FIG. 1(A), in a first step, a MOS device precursor 1, fabricated according to conventional techniques not described herein in order not to unnecessarily obscure the present invention, is provided, comprising a doped monocrystalline silicon (Si) substrate 10 of first conductivity type (p or n), with a thin gate dielectric layer 11, typically of a silicon oxide about 25–50 Å thick, formed on a portion of the substrate surface destined to overlie the channel region of the transistor. Contiguous and forming a layer stack with the gate dielectric layer 11 is a thicker gate electrode layer 12, typically of heavily-doped polysilicon, for providing electrical contact to the gate or channel region. First, or inner, insulative sidewall spacer layers 13 of a relatively etch resistant dielectric material, preferably a silicon oxide, are optionally formed in conventional manner (as by blanket deposition or thermal growth of a silicon oxide layer over the entire substrate surface, followed by selective anisotropic etching of the horizontally aligned surfaces thereof), on each of the opposing side surfaces of the gate insulator/gate electrode layer stack 11/12. Sidewall spacer layers 13 are relatively narrow and formed with a predetermined tapered width profile, the widths thereof varying from relatively wide at the lower ends in contact with the surface of the substrate 10 to relatively narrow at the upper ends. In addition to silicon oxides, the first, or inner, sidewall spacers 13 may also be comprised of silicon nitride or silicon oxynitride materials. Further, notwithstanding the substantial resistance of the as-deposited, undensified first sidewall spacer layer materials to etching with, e.g., dilute aqueous HF, the etching resistance thereof against dilute aqueous HF may be further increased by subjecting the as-deposited first sidewall spacer layers 13 to a thermal treatment for densification, e.g., rapid thermal annealing (RTA), to yield low etching rates with dilute aqueous HF.

Figure 1B:
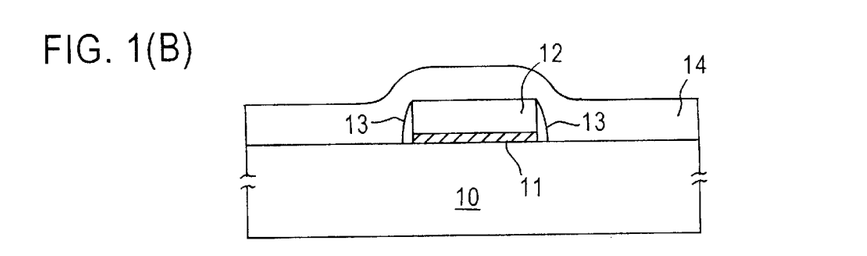

Referring now to FIG. 1(B), a layer 14 of a second dielectric material, the as-deposited etching resistance of which against dilute aqueous HF being substantially lower than that of the first dielectric material, e.g., a UV-nitride, is blanket-deposited over the surface of the dielectric gate oxide/gate electrode layer stack 11/12. UV-nitride layers 14 typically are undensified as-deposited and fairly easily etched with dilute aqueous HF, e.g., 1:100 HF/$H_2O$ at moderate temperatures of from about 20 to about 35° C. Densified UV-nitride layers, such as are obtained subsequent to thermal annealing treatment at elevated temperatures, are substantially more difficult-to-etch under essentially equivalent conditions; consequently, according to the inventive method, device processing at elevated temperatures is avoided prior to removal of the second sidewall spacer layers, as will be explained below.

Figure 1C:
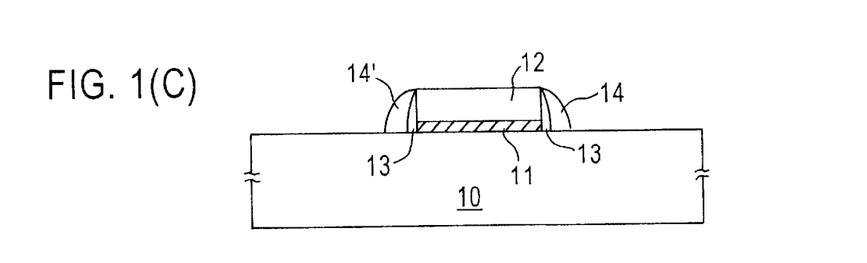

FIG. 1(C) shows the result of anisotropic etching of the horizontally oriented surfaces of the as-deposited, undensified UV-nitride layer 14 using dilute aqueous HF according to the conditions described supra. Selective removal of the horizontally oriented portions of the UV-nitride layer overlying the substrate 10 surface and the upper surface of the gate electrode layer 12 results in the formation of relatively wide, approximately quarter circle-shaped second, or outer, sidewall spacer layers 14' in contact with the outer surfaces of the first insulative sidewall spacers 13. The relatively wide second sidewall spacers 14' have a tapered width profile in cross-section varying from relatively wide at their lower ends thereof in contact with the surface of the substrate 10 to relatively narrower at their upper ends. Inasmuch as the relatively wide second sidewall spacers 14' provide the major portion of the masking function of the sidewall spacers during subsequent dopant ion implantation, the conditions for the selective anisotropic etching of the as-deposited, undensified UV-nitride layer are selected so as to yield a desired width of the second sidewall spacer layers 14' at their lower ends, which width is selected for optimization of the subsequently formed lightly- or moderately-doped source/drain extension region of the asymmetrically configured transistor.

Figure 1D:
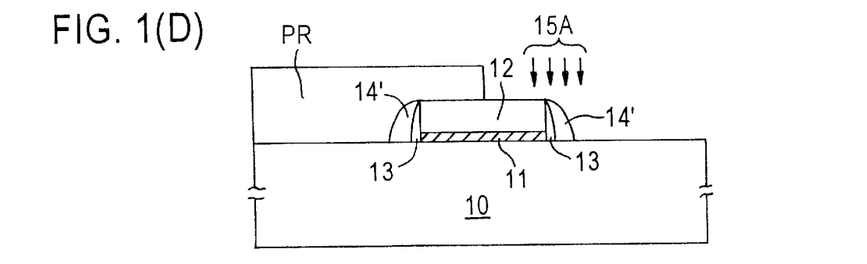

Adverting to FIG. 1(D), and according to an essential feature of the present invention, following formation of second sidewall spacers 14' of predetermined width profile, a layer of a masking material, e.g., a photoresist layer PR, is selectively formed, as by conventional photolithographic masking and etching techniques not described herein for brevity, to cover a portion of substrate 10 surface and a portion of the gate insulator/gate electrode layer stack 11/12 and one of the associated sidewall spacer layer pairs 13/14'. Alternatively, a patterned ion implantation mask may be positioned above the substrate for defining areas to be selectively implanted. The exposed sidewall spacer layer pair 13/14' is then selectively treated, as by ion implantation thereinto, for further reducing the resistance of the outer, relatively wide spacer layer 14' against etching, e.g., with dilute aqueous HF at about room temperature. Stated differently, the exposed outer, relatively wide sidewall spacer 14' is effectively selectively treated by ion implantation thereinto to augment the difference in HF etch rate vis-a-vis the inner, relatively narrow sidewall spacer 13. Implantable species 15A which may be employed for increasing the etchability of e.g., oxide and nitride-based undensified dielectric materials employed as the outer, relatively wide sidewall spacer 14' according to the inventive method, include $Si^+$ and $Ge^+$ ions, as well as p and n type dopants such as boron, phosphorus, arsenic, and antimony-containing ions. Suitable implantation dosages and energies of ions 15A can be selected for achieving satisfactory or optimum etching rates for a particular application. By way of illustration but not limitation, the etch rate with 1:100 $HF/H_2O$ (at 20–35° C.) of undensified, as-deposited UV-nitride outer sidewall spacers 14', formed as described above, is further increased as a result of implantation of $Si^+$ or $Ge^+$ ions. While the exact mechanism of the observed increase in etch rate is not known with certainty, and not desiring to being bound by any particular theory, it is believed that lattice damage of the undensified spacer material 14' upon ion implantation facilitates entry of etchant into the material along lattice faults and cleavage planes, resulting in increased etchant penetration. In any event, the ease with which the outer, relatively wide sidewall spacer 14' is etched, relative to the inner sidewall pacer 13, is substantially augmented as a consequence of the above-described selective implantation treatment.

Figure 1E:
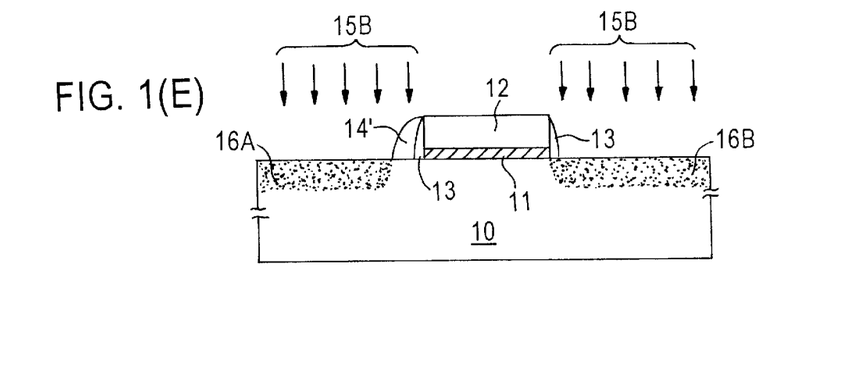

Referring now to FIG. 1(E), the photoresist layer PR is removed, as by conventional techniques, and the treated exposed outer, relatively wide sidewall spacer layer 14' is removed by etching with dilute aqueous HF at an augmented removal rate as described above (the order of removal not being critical to the practice of the invention). Dopant-containing ions 15B of second conductivity type opposite that of substrate 10 are then selectively implanted (optionally via a suitably patterned implantation mask, not shown), with layer stack 11/12 and the remaining relatively wide outer sidewall spacer 14' acting as implantation masks, to form moderately to heavily-doped regions 16A and 16B. Region 16A extends to just beneath the respective proximal edge of spacer 14' and thus is laterally spaced away from the respective proximal edge of the gate insulator/gate electrode layer stack 11/12 by a distance which substantially corresponds to the width of the relatively wide spacer 14' at its lower end adjacent the substrate 10 surface, whereas region 16B extends to just beneath the respective proximal edge of layer stack 11/12, thereby constituting an asymmetrically-configured structure. The heavy dopant ion implantation is performed at a dosage and energy selected for optimal transistor performance. For example, by way of illustration but not limitation, for a p-type Si substrate intended to comprise an n-channel transistor, n-type dopant impurities 15B, typically chosen from phosphorus (P), arsenic (As), and antimony (Sb), are implanted at a dosage of from about $5 \times 10^{14}$ to about $5 \times 10^{15}$ atoms/cm$^2$ at an energy of from about 40 to about 60 KeV. Conversely, for an n-type Si substrate intended to comprise a p-channel transistor, p-type dopant impurities 15B (typically boron) are implanted at similar dosages but at lower energies of from about 20 to about 40 KeV.

Figure 1F:
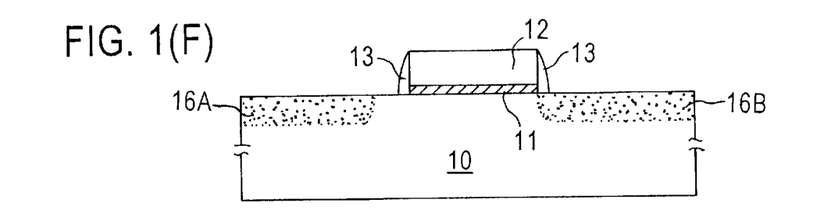

With reference now to FIG. 1(F), and according to another essential feature of the instant invention, in the next step of the process sequence, the remaining undensified outer, relatively wide sidewall spacer 14' is removed by etching, e.g., with dilute aqueous HF in the case of UV-nitride spacers. Inasmuch as the spacer removal step is performed on undensified (i.e., non-heat treated) spacer material, etching is performed at ambient temperatures (e.g., 20–35° C.) and at removal rates, such as described above, which result in significantly less undesired collateral etching, wafer damage, and defect formation. For example, removal by etching of the remaining undensified, as-deposited (i.e., not augmented by ion implantation) UV-nitride spacer 14' can be readily accomplished with 1:100 $HF/H_2O$ at 20–35° C. As compared with the about 1.5 hour interval required for etching of silicon nitride spacers with hot $H_3PO_4$ at 180° C. according to the prior art, the process of the instant invention provides a substantial and significant reduction in the requisite duration and severity of etching conditions, thereby simultaneously increasing manufacturing throughput and reducing corrosive attack and resultant damage to the wafer workpiece. As illustrated, the densified, relatively etch-resistant, first, or inner, sidewall spacers 13 are substantially unaffected by the aforesaid etching process and remain in place throughout subsequent device fabrication processing.

Figure 1G:
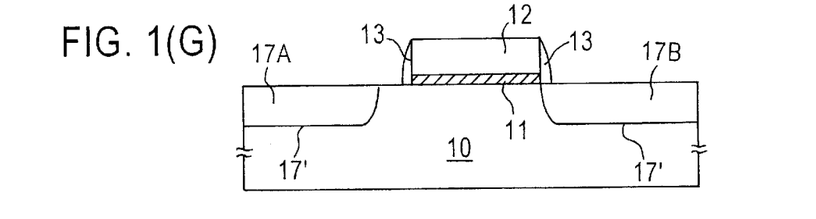

Referring now to FIG. 1(G), following removal of sidewall spacer 14', the thus-formed transistor precursor is treated, as by rapid thermal annealing (RTA), so as to form asymmetrically-configured source/drain regions 17A and 17B, each having a predetermined junction depth below the substrate 10 surface. In the case of moderately to heavily-doped n-type source/drain regions 17, RTA is conducted at a temperature of from about 1,000 to about 1,100° C., typically about 1,050° C., for from about 10 to about 45 seconds, typically about 30 seconds, to activate and diffuse the implanted dopant ions 15B and reduce/relax lattice damage, stress, and distortion resulting from the implantation process. In the case of moderately to heavily-doped p-type source/drain regions 17A,17B, RTA is performed at a temperature of from about 900 to about 1,000° C., typically about 1,000° C., for from about 10 to about 45 seconds, typically about 10 seconds, for effecting dopant activation, diffusion, and lattice damage relaxation.

Figure 1H:
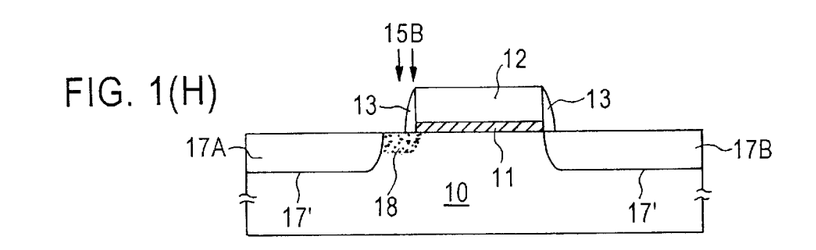

Referring now to FIG. 1(H), in the next step according to the inventive method, dopant containing ions 15B of opposite, i.e., second, conductivity type to that of semiconductor substrate 10 are selectively implanted, as by use of a patterned implantation mask (not shown), to form a shallow, lightly or moderately-doped extension region 18 ("extension implant") in the space between the laterally spaced-away, moderately to heavily-doped first source/drain region 17A and just underlying the respective proximal edge of the gate insulator/gate electrode layer stack 11/12. Implantation is performed at lower dosages and energies than previously employed for forming source/drain regions 17A, 17B. In the case of n-type dopant impurities 15B, implantation is performed at a dosage of from about $5 \times 10^{13}$ to about $5 \times 10^{14}$ atoms/cm$^2$ and at an energy of from about 10 to about 30 KeV. In the case of p-type dopant impurities 15B, implantation is performed at a similar dosage but at a lower energy of from about 5 to about 10 KeV.

Figure 1I:
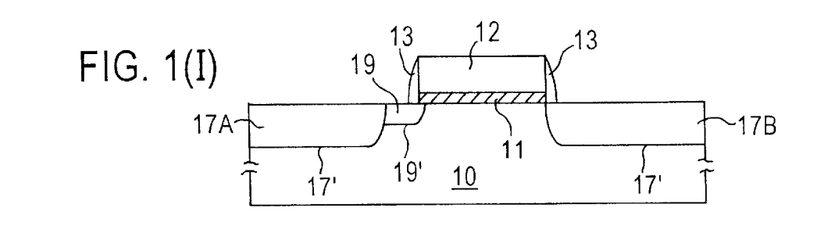

With reference to FIG. 1(I), the thus-implanted asymmetrically configured MOS-type structure is then subjected to a thermal treatment, typically RTA, for activating/diffusing the implanted dopant impurities 15B in the shallow, lightly or moderately-doped extension region 18 and for relaxation of lattice damage and stress resulting from the implantation process, thereby forming shallow, lightly or moderately-doped source/drain extension 19 with junction 19' depth.

Figure 1J:
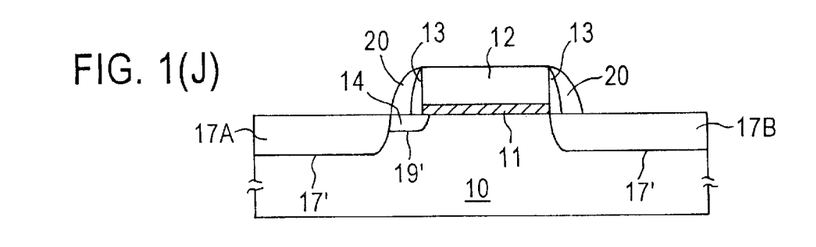

As shown in FIG. 1(J), outer, relatively wide insulative sidewall spacers 20 are then re-formed over the inner, relatively narrow sidewall spacers 13, as by conventional techniques not described herein for brevity, along the opposing side surfaces of the gate insulator/gate electrode layer stack 11/12, for protecting the layer stack and source/drain extension 19 during subsequent processing, e.g., for contact formation and metallization processing. The re-formed second sidewall spacers 20 may comprise one or more dielectric material layers selected from polysilicon, silicon oxides, silicon nitrides, silicon oxynitrides, and UV-nitrides.

The present invention thus enables formation of reliable, defect-free submicron-dimensioned, asymmetrically-configured MOS transistors at increased rates of manufacturing throughput, by utilizing an augmented etch rate material for one of the outer, relatively wide dielectric sidewall spacers, which material provides a very significant reduction in the time necessary for etching processing. In addition, the etching is performed under milder conditions, vis-a-vis the hot phosphoric acid etching according to the prior art, whereby deleterious effects due to long periods of exposure to the hot etchant are significantly reduced or eliminated.

The present invention is applicable to the formation of various types of submicron-dimensioned, asymmetrically-configured transistors, including CMOS transistors as well as MOS transistors, and is fully compatible with conventional process flow for automated manufacture of high-density integration semiconductor devices.

In the previous description, numerous specific details are set forth, such as specific materials, structures, reactants, processes, etc. in order to provide a better understanding of the present invention. However, the present invention can be practiced without resorting to the details specifically set forth. In other instances, well-known processing materials and techniques have not been described in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, which method comprises the sequential steps of:

(a) providing a device precursor structure comprising a semiconductor substrate of a first conductivity type and a layer stack formed on a portion of a surface of said substrate, said layer stack comprising:
      i. a thin gate insulating layer in contact with said substrate surface; and
      ii. a gate electrode layer formed on said gate insulating layer, said layer stack comprising first and second opposing side surfaces and a top surface;

(b) forming first and second insulative, tapered sidewall spacers on respective first and second opposing side surfaces of said layer stack, each of said sidewall spacers comprising a dielectric material having an as-deposited etch resistance;

(c) selectively positioning a masking material over said first sidewall spacer on the first opposing side surface of said layer stack;

(d) selectively treating the exposed second sidewall spacer on the second opposing side surface of said layer stack with impurities for reducing the etch resistance of said dielectric material from its as-deposited state to a more readily-etchable state;

(e) removing the masking material from over said first sidewall spacer;

(f) selectively removing the reduced etching resistance second sidewall spacer by an etching process;

(g) selectively introducing dopant impurities of a second, opposite conductivity type into exposed portions of said substrate surface adjacent said first sidewall spacer and adjacent said second opposing side surface of said layer stack to form a pair of spaced-apart, heavily-doped regions in said substrate;

(h) removing the first sidewall spacer by an etching process;

(i) thermally treating said pair of spaced-apart, heavily-doped regions to form a pair of heavily-doped source/drain regions in said substrate each having a junction therewith at a predetermined depth below said substrate surface, a first one of said pair of heavily-doped source/drain regions being laterally spaced away from a respective proximal edge of said gate insulating layer by a distance substantially equal to the width of the lower end of said first sidewall spacer adjacent said substrate surface and a second one of said pair of heavily-doped source/drain regions extending to just beneath a respective proximal edge of said gate insulating layer;

(j) selectively introducing second, opposite conductivity type dopant impurities into the exposed portion of said substrate surface intermediate said gate insulating layer and said first, laterally spaced-away, heavily-doped source/drain region to form a lightly- or moderately-doped extension region; and (k) thermally treating said lightly- or moderately-doped extension region to form a shallow-depth, lightly- or moderately-doped source/drain extension in said substrate extending from the proximal edge of the first, laterally spaced-away, heavily-doped source/drain region to just beneath the respective proximal edge of said gate insulating layer.

2. The method as in claim 1, wherein step (a) comprises providing a silicon wafer substrate of n or p first conductivity type, said thin gate insulating layer comprises a silicon oxide layer about 25–50 Å thick, and said gate electrode layer comprises heavily-doped polysilicon.

3. The method as in claim 2, wherein step (b) comprises forming said first and second sidewall spacers from a dielectric material having an as-deposited etch resistance which can be altered by subsequent treatment(s).

4. The method as in claim 3, wherein step (b) comprises forming said sidewall spacers from a UV-nitride.

5. The method as in claim 3, wherein each of said tapered sidewall spacers has a width profile varying from relatively wider at the lower ends thereof adjacent said substrate surface relatively narrower at the upper ends thereof.

6. The method as in claim 2, wherein step (c) comprises selectively forming a layer of photoresist over said first sidewall spacer.

7. The method as in claim 2, wherein: step (c) comprises selectively positioning an ion implantation mask over said first sidewall spacer; and step (d) comprises selective ion implantation of said second sidewall spacer.

8. The method as in claim 7, wherein: step (d) comprises selectively implanting impurity ions selected from $Si^+$, $Ge^+$, and p and n type dopant ions; and step (f) comprises selectively removing the ion-implanted, reduced etching resistance second insulative sidewall spacer by etching with dilute aqueous HF.

9. The method as in claim 8, wherein step (f) comprises etching the second insulative spacer with 1:100 $HF/H_2O$ at about 20–35° C.

10. The method as in claim 2, wherein step (g) comprises selectively implanting dopant ions of second, opposite conductivity type at dosages of from about $5 \times 10^{14}$ to about $5 \times 10^{15}$ atoms/$cm^2$ and energies of from about 20 to about 60 KeV.

11. The method as in claim 2, wherein step (h) comprises etching the first sidewall spacer with 1:100 $HF/H_2O$ at about 20–35° C.

12. The method as in claim 2, wherein step (i) comprises rapid thermal annealing to diffuse and activate said second conductivity type dopant impurities introduced during step (g) to form said pair of heavily-doped, relatively deep, source/drain regions.

13. The method as in claim 2, wherein step (j) comprises selectively implanting dopant ions of second conductivity type at dosages of from about $5 \times 10^{13}$ to about $5 \times 10^{14}$ atoms/$cm^2$ and energies of from about 5 to about 30 KeV.

14. The method as in claim 2, wherein step (k) comprises rapid thermal annealing to diffuse and activate said second conductivity type dopant impurities introduced during step (j) to form said shallow-depth, lightly- or moderately-doped source/drain extension.

15. The method as in claim 2, comprising forming a relatively narrow sidewall spacer on each of said first and second opposing side surfaces of said layer stack prior to performing step (b), said relatively narrow sidewall spacers comprising an etch resistant material which is retained throughout processing.

16. The method as in claim 15, comprising forming said relatively narrow sidewall spacers from a dielectric material selected from silicon oxides, silicon nitrides, and silicon oxynitrides, wherein each of said relatively narrow sidewall spacers has a tapered width profile varying relatively wider at the lower end thereof adjacent said substrate surface to relatively narrower at the upper end thereof.

17. A method of manufacturing a silicon-based MOS-type transistor, which method comprises the sequential steps of:

(a) providing a MOS transistor precursor structure comprising a silicon semiconductor wafer substrate of a first conductivity type and a layer stack formed on a portion of a surface of said wafer, said layer stack comprising:
  i. a thin gate insulating layer comprising a silicon oxide layer about 25–50 Å thick in contact with said wafer surface; and
  ii. a gate electrode layer comprising heavily-doped polysilicon formed on said gate insulating layer, said layer stack comprising first and second opposing side surfaces and a top surface;

(b) forming first and second relatively narrow, insulative, tapered sidewall spacers on respective ones of said first and second opposing side surfaces, said first and second relatively narrow sidewall spacers comprising a first, relatively etch-resistant dielectric material selected from silicon oxides, silicon nitrides, and silicon oxynitrides;

(c) forming first and second relatively wide, insulative, tapered sidewall spacers on respective ones of said first and second relatively narrow sidewall spacers, said first and second relatively wide sidewall spacers comprising a second dielectric material comprising a UV-nitride having an as-deposited etch resistance;

(d) selectively positioning a masking material over the sidewall spacers on the first opposing side surface of said layer stack;

(e) selectively implanting the exposed second, relatively wide sidewall spacer on the second opposing side surface of said layer stack with impurities for reducing the etch resistance thereof from its as-deposited state to a more readily-etchable state;

(f) removing the masking material from over the sidewall spacers on the first opposing side surface of said layer stack;

(g) selectively removing the reduced etching resistance, second relatively wide sidewall spacer layer by etching with dilute aqueous HF;

(h) selectively implanting dopant impurities of a second, opposite conductivity type into exposed portions of said substrate surface adjacent said first relatively wide sidewall spacer and adjacent said second relatively narrow sidewall spacer to form a pair of spaced-apart, heavily-doped implants in said wafer;

(i) removing the first relatively wide sidewall spacer by an etching process with dilute aqueous HF;

(j) performing rapid thermal annealing to diffuse and activate the dopant impurities implanted in step (h), thereby forming a pair of heavily-doped source/drain regions in said wafer substrate, each having a junction therewith at a predetermined depth below said wafer surface, a first one of said pair of heavily-doped source/drain regions being laterally spaced away from a respective proximal edge of said gate insulating layer by a distance substantially equal to the combined width of the lower ends of said relatively narrow and relatively wide sidewall spacers adjacent said wafer surface and a second one of said pair of heavily-doped source/drain regions extending to just beneath a respective proximal edge of said gate insulating layer;

(k) selectively implanting second, opposite conductivity type dopant impurities into the exposed portion of said wafer surface intermediate said gate insulating layer and said first, laterally spaced-away, heavily-doped source/drain region to form a lightly- or moderately-doped extension region; and (l) performing rapid thermal annealing to diffuse and activate the dopant impurities implanted in step (k), thereby forming a shallow-depth, lightly- or moderately-doped source/drain extension extending from the proximal edge of the first, laterally spaced-away, heavily-doped source/drain region to just beneath the respective proximal edge of said gate insulating layer.

18. The method as in claim 17, wherein: step (e) comprises implanting ions selected from $Si^+$, $Ge^+$, and p and n type dopant ions; and step (g) comprises etching the second relatively wide insulative spacer with 1:100 $HF/H_2O$ at about 20–35° C.

* * * * *